United States Patent
Kanemaru et al.

(10) Patent No.: US 11,914,505 B2
(45) Date of Patent: Feb. 27, 2024

(54) API ADAPTER TEST SYSTEM, API ADAPTER TEST ASSISTANCE DEVICE, API ADAPTER TEST ASSISTANCE METHOD, AND API ADAPTER TEST ASSISTANCE PROGRAM

(71) Applicant: Nippon Telegraph and Telephone Corporation, Tokyo (JP)

(72) Inventors: Sho Kanemaru, Tokyo (JP); Kensuke Takahashi, Tokyo (JP); Tomoki Ikegaya, Tokyo (JP); Satoshi Kondo, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 386 days.

(21) Appl. No.: 17/433,303

(22) PCT Filed: Feb. 13, 2020

(86) PCT No.: PCT/JP2020/005619
§ 371 (c)(1),
(2) Date: Aug. 24, 2021

(87) PCT Pub. No.: WO2020/175161
PCT Pub. Date: Sep. 3, 2020

(65) Prior Publication Data
US 2022/0138091 A1    May 5, 2022

(30) Foreign Application Priority Data
Feb. 27, 2019    (JP) .................................. 2019-033972

(51) Int. Cl.
*G06F 11/00* (2006.01)
*G06F 11/36* (2006.01)

(52) U.S. Cl.
CPC ...... *G06F 11/3688* (2013.01); *G06F 11/3684* (2013.01); *G06F 11/3692* (2013.01)

(58) Field of Classification Search
CPC ............... G06F 11/273; G06F 11/3688; G06F 11/3692; G06F 11/3684
See application file for complete search history.

(56) References Cited

U.S. PATENT DOCUMENTS 11,704,187 B1 * 7/2023 Goad .................... G06F 11/079
   714/33
2017/0123863 A1 * 5/2017 Erickson .................. G06F 9/54
(Continued)

OTHER PUBLICATIONS

Take et al., "Method to Simplify API Adapter Development Using GUI," IEICE 2018 Society Tournament, Sep. 11, 2018, 3 pages (With English Translation).

*Primary Examiner* — Charles Ehne
(74) *Attorney, Agent, or Firm* — Fish & Richardson P.C.

(57) ABSTRACT

Provided is an API adapter test system capable of easily determining the health of an API adapter. An API adapter test system 1 includes: an API adapter test assistance device 20 that assists a health determination test of a predetermined API adapter; a developer terminal 10; and a wholesale API simulation device 30. The API adapter test assistance device 20 includes: a wholesale service API simulation function deployment unit 24 that deploys an execution file for causing the API adapter to execute a simulation conversion process in the wholesale service API simulation device 30; a test scenario creation unit 25 that generates test scenario information indicating a response content expected to be obtained by the simulation conversion process for each query pattern used in the test process; and a test result information generation unit 27 that determines, for each query pattern, whether the expected response content is obtained by the simulation conversion process, and trans- (Continued)

mits generated test result information to the developer terminal 10.

4 Claims, 4 Drawing Sheets

(56) References Cited

U.S. PATENT DOCUMENTS

2023/0089336 A1* 3/2023 Battiato .............. G06F 11/3684
717/124
2023/0093659 A1* 3/2023 O'Dell ..................... G06F 9/54
719/328

\* cited by examiner

Fig. 4

```
1,OK,200,operatorId=companyA
2,OK,200,operatorId=companyA,companyB
3,OK,404,operatorId=companyA&imsi=9999999999999
4,OK,200,operatorId=companyA&imsi=12345678901234 5
5,OK,200,operatorId=companyA&imsi=12345678901234 5&month=2018-11
6,OK,200,operatorId=companyA&imsi=12345678901234 5&month=2018-11,2018-12
7,OK,200,operatorId=companyA&imsi=12345678901234 5,23456789012345 6
8,OK,200,operatorId=companyA&imsi=12345678901234 5,23456789012345 6&month=2018-11
9,OK,200,operatorId=companyA&imsi=12345678901234 5,23456789012345 6&month=2018-11,2018-12
10,NG,404,operatorId=companyA&imsi=3456789012345 67
11,NG,404,operatorId=companyA&imsi=3456789012345 67&month=2018-11
12,NG,404,operatorId=companyA&imsi=3456789012345 67&month=2018-11,2018-12
13,OK,200,operatorId=companyB
14,OK,200,operatorId=companyB&month=2018-11
15,OK,200,operatorId=companyB&month=2018-11,2018-12
16,NG,404,operatorId=companyB&imsi=12345678901234 5
```

API ADAPTER TEST SYSTEM, API ADAPTER TEST ASSISTANCE DEVICE, API ADAPTER TEST ASSISTANCE METHOD, AND API ADAPTER TEST ASSISTANCE PROGRAM

CROSS-REFERENCE TO RELATED APPLICATIONS

This application is a National Stage application under 35 U.S.C. § 371 of International Application No. PCT/JP2020/005619, having an International Filing Date of Feb. 13, 2020, which claims priority to Japanese Application Serial No. 2019-033972, filed on Feb. 27, 2019. The disclosure of the prior application is considered part of the disclosure of this application, and is incorporated in its entirety into this application.

TECHNICAL FIELD

The present invention relates to an API adapter test system, an API adapter test assistance device, an API adapter test assistance method, and an API adapter test assistance program for determining the health of an API adapter created by an API adapter creation device.

BACKGROUND ART

In recent years, with the spread of B2B2X (Business To Business To X), a new service has been constructed and operated by combining a plurality of services. Here, since new services appear and the specifications of existing services are frequently changed, service providers are required to respond to these changes quickly and at low cost.

In order to deal with this, a technique for automatically generating an API adapter that absorbs and collaborates the differences in specifications of API (Application Program Interface) for respective services published by each business operator has been developed.

CITATION LIST

Non Patent Literature

[NPL 1] "*GUI wo motiita API Adaputa Kaihatu Youika Housiki nikansuru Itikentou* (A Study on Easy API Adapter Development Method Using GUI)", Naoki Take, Yuki Ikeya, Nobuo Kouchi, Kensuke Takahashi, Miwa Otani, and Hiroshi Kato (NTT), IEICE Society Conference 2018 B-14-13

SUMMARY OF THE INVENTION

Technical Problem

As mentioned above, the automatically generated API adapter needs to be confirmed for its health before use. However, there is a problem that in order to perform this confirmation operation, a device equipped with integration test scenario information for confirming health, a function of executing an API according to integration test scenario information, and a function of simulating a target API using an API adapter is required, and an operator needs to have knowledge, skill, and time regarding the operation specifications of the API adapter, which incurs cost, time and labor.

The present invention has been made in view of the above circumstances, and an object thereof is to provide an API adapter test system, an API adapter test assistance device, an API adapter test assistance method, and an API adapter test assistance program capable of easily determining the health of an API adapter.

Means for Solving the Problem

An API adapter test system of the present invention for solving the problem is an API adapter test system including: an API adapter test assistance device that assists a health determination test of an API adapter for an API of a predetermined service; a developer terminal connected to the API adapter test assistance device; and a service API simulation device connected to the API adapter test assistance device and the API adapter test assistance device, wherein the developer terminal includes: a data transmission unit that transmits first specification data that defines Northbound-API (NB-API) specifications, second specification data that defines service API specifications, test parameters used for the health determination test, and service simulation data for generating response data for a second API request after a first API request which is an input signal to the API adapter is converted by the API adapter to the API adapter test assistance device; and a test result information acquisition unit that acquires test result information transmitted from the API adapter test assistance device when data is transmitted from the data transmission unit, the service API simulation device includes: a service API simulation function execution unit that transmits a second API response that is a response to the second API request in order to perform the health determination test of the API adapter, and the API adapter test assistance device includes: a service API simulation function deployment unit that generates a stub for the second API request using the second specification data transmitted from the developer terminal and the service simulation data and transmits the stub for deployment in the service API simulation function execution unit of the service API simulation device; a test scenario creation unit that generates a query pattern to be included in the first API request used for the health determination test on the basis of the first specification data transmitted from the developer terminal and the test parameters and generates a test scenario indicating an expected response content using the service simulation data for each query pattern; a test scenario execution unit that executes the generated test scenario; and a test result information generation unit that receives a first API response in which the second API response is converted by the API adapter and determines the health on the basis of whether an expected response is obtained for each query pattern.

Effects of the Invention

According to the API adapter test system, the API adapter test assistance device, the API adapter test assistance method, and the API adapter test assistance program of the present invention, it is possible to easily determine the health of an API adapter created by an API adapter creation device.

BRIEF DESCRIPTION OF DRAWINGS

FIG. 4 is an example of test result information generated by the API adapter test assistance device of the API adapter test system according to the embodiment.

DESCRIPTION OF EMBODIMENTS

Hereinafter, as an embodiment of the present invention, an API adapter test system that performs a test process for determining the health of a wholesale service API adapter Y created for the API of a wholesale service X will be described.

Configuration of API Adapter Test System According to Embodiment

Figure 1:
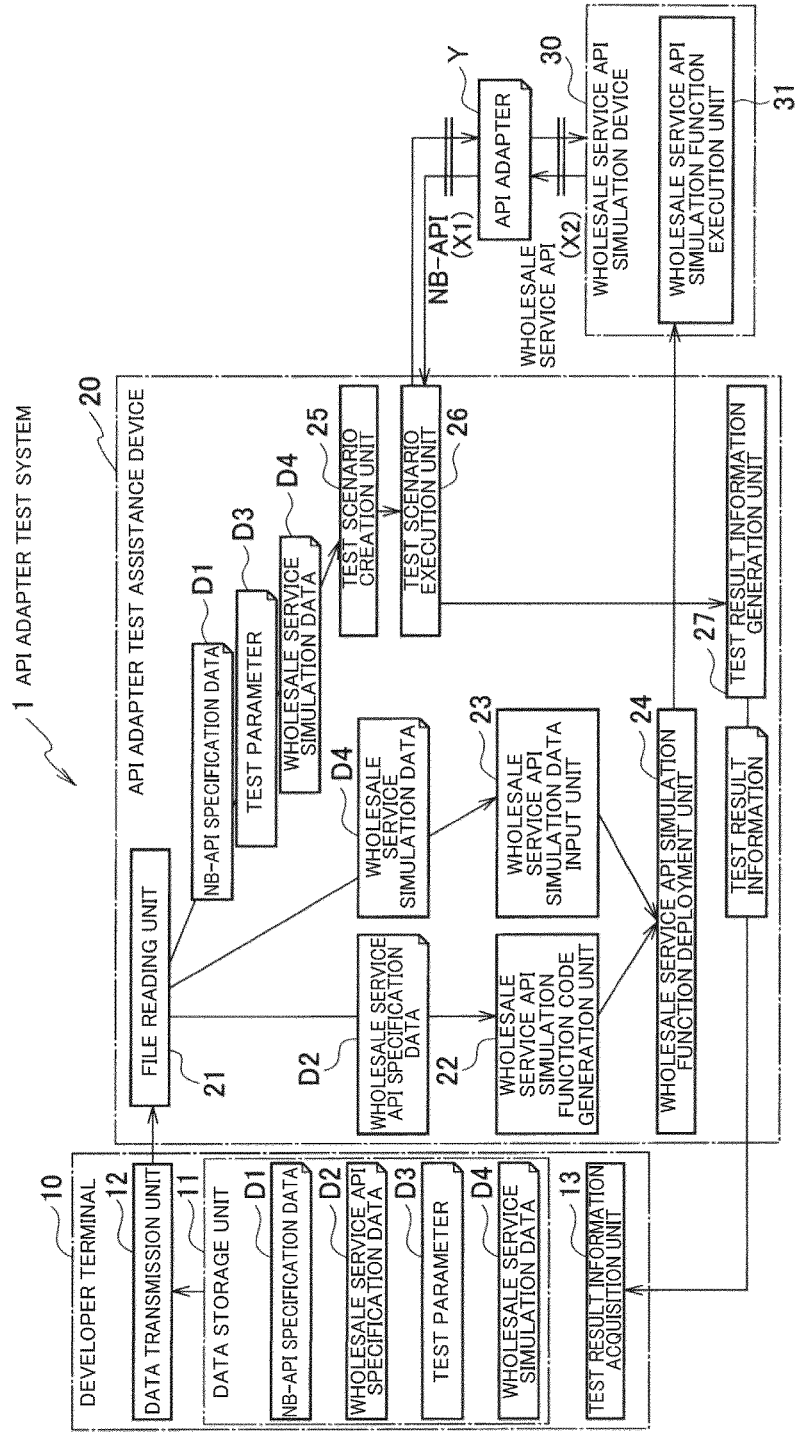
FIG. 1 is a block diagram illustrating a configuration of an API adapter test system according to an embodiment of the present invention.

As illustrated in FIG. 1, an API adapter test system according to the present embodiment includes a developer terminal 10, an API adapter test assistance device 20, and a wholesale service API simulation device 30. The developer terminal 10 is operated by a developer who performs a health determination test for a target API adapter Y. The API adapter test assistance device 20 assists the health determination test. The wholesale service API simulation device 30 is connected to the developer terminal 10 and the API adapter test assistance device 20.

The developer terminal 10 has a data storage unit 11, a data transmission unit 12, and a test result information acquisition unit 13. The data storage unit 11 includes NB-API (Northbound API) specification data D1 as first specification data, wholesale service API specification data D2 as second specification data, a test parameter D3, and wholesale service simulation data D4. The NB-API specification data D1 is API specification data made up of a swagger specification file for defining the NB-API specifications of the wholesale service X before being converted by the test target API adapter Y. The wholesale service API specification data D2 is API specification data for defining the wholesale service API specifications in which the API signal is converted by the API adapter Y. The test parameter D3 is information indicating the test parameters used for the health determination test process in the NB-API signal input to the API adapter Y. The wholesale service simulation data D4 is data for generating response data for a second API request after a first API request, which is an input signal to the API adapter Y, is converted by the API adapter Y.

The data transmission unit 12 transmits the file information in which the data stored in the data storage unit 11 is stored to the API adapter test assistance device 20 on the basis of the operation of the developer. The test result information acquisition unit 13 is configured as a display device and acquires and outputs the test result information transmitted from the API adapter test assistance device 20.

The API adapter test assistance device 20 includes a file reading unit 21, a wholesale service API simulation function code generation unit 22, a wholesale service API simulation data input unit 23, a wholesale service API simulation function deployment unit 24, a test scenario creation unit 25, a test scenario execution unit 26, and a test result information generation unit 27.

The file reading unit 21 reads the file information transmitted from the developer terminal 10. The wholesale service API simulation function code generation unit 22 generates the source code information of a PostgreSQL table using the wholesale service API specification data D2 in the file information transmitted from the developer terminal 10. The wholesale service API simulation data input unit 23 inserts the data in the wholesale service API simulation data D4 into the source code information of the table generated by the wholesale service API simulation function code generation unit 22.

The wholesale service API simulation function deployment unit 24 generates a stub for the second API request using the second specification data D2 transmitted from the developer terminal 10 and the wholesale service simulation data D4 and transmits the same for deployment to the wholesale service API simulation function execution unit 31 of the wholesale service API simulation device 30.

The test scenario creation unit 25 generates a query pattern to be included in the first API request used for the health determination test on the basis of the NB-API specification data D1 and the test parameter D3 transmitted from the developer terminal 10. Further, the test scenario creation unit 25 generates a test scenario indicating an expected response content using the service simulation data for each query pattern.

The test scenario execution unit 26 executes the generated test scenario and receives the response result thereof. The test result information generation unit 27 receives a first API response in which the second API response is converted by the API adapter Y. Then, the test result information generation unit 27 determines the health for each query pattern on the basis of whether the first API response is the expected response. Then, the test result information generation unit 27 generates the test result information of the health determination test and transmits the same to the developer terminal 10.

The wholesale service API simulation device 30 has a wholesale service API simulation function execution unit 31 that receives a second API request and transmits a second API response that is a response to the second API request in order to perform a health determination test of the API adapter.

Operation of API Adapter Test System According to Embodiment

Figure 2:
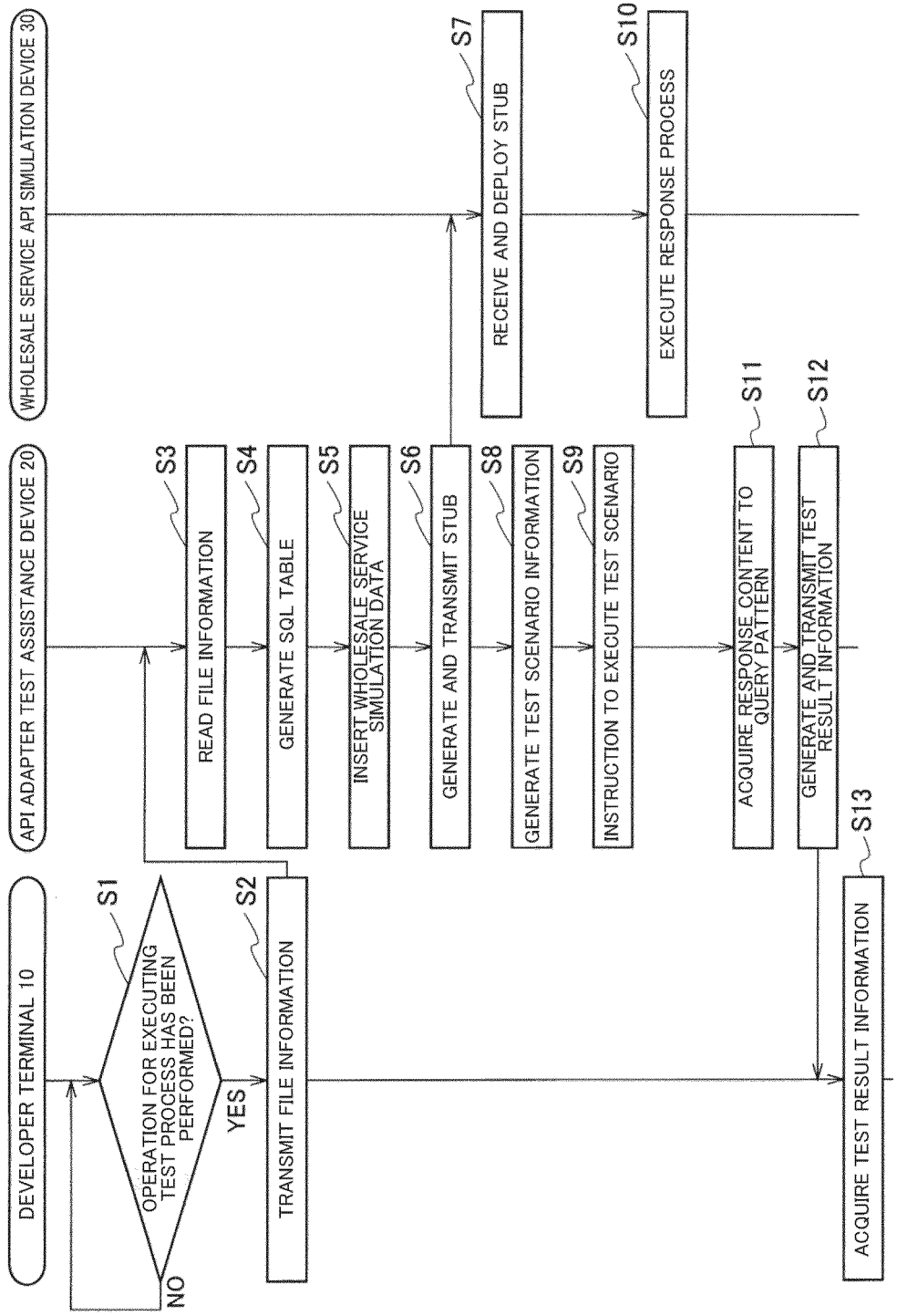
FIG. 2 is a sequence diagram illustrating an operation of the API adapter test system according to an embodiment of the present invention.

Next, the operation of the API adapter test system according to the present embodiment will be described with reference to the sequence diagram of FIG. 2.

First, when the developer performs an operation for executing the health determination test process of the API adapter Y (S1: "YES"), the data transmission unit 12 of the developer terminal 10 stores the data in the data storage unit 11 transmits file information in which the NB-API (Northbound API) specification data D1, the wholesale service API specification data D2, the test parameter D3, and the wholesale service simulation data D4 stored in the data storage unit 11 are stored to the API adapter test assistance device 20 (S2).

In the API adapter test assistance device 20, the file information transmitted from the developer terminal 10 is read by the file reading unit 21 (S3). When the file information is read by the file reading unit 21, the wholesale service API simulation function code generation unit 22 generates the source code information of the PostgreSQL table using the wholesale service API specification data D2, and the wholesale service API simulation function deployment unit 24 acquires the source code information (S4). Then, the wholesale service API simulation data input unit 23 inserts the data in the wholesale service simulation data D4 into the source code information of the PostgreSQL table acquired by the wholesale service API simulation function deployment unit 24 (S5). Further, the wholesale service API simulation function deployment unit 24 generates a stub for the second API request and transmits the same to the wholesale service API simulation device 30 (S6).

The wholesale service API simulation device 30 receives and deploys the stub transmitted from the wholesale service API simulation function deployment unit 24 (S7). For example, the stub is deployed in such a way that a virtual machine as the wholesale service API simulation device 30 is started or the wholesale service API simulation device 30 is started by a docker compose.

Figure 3:
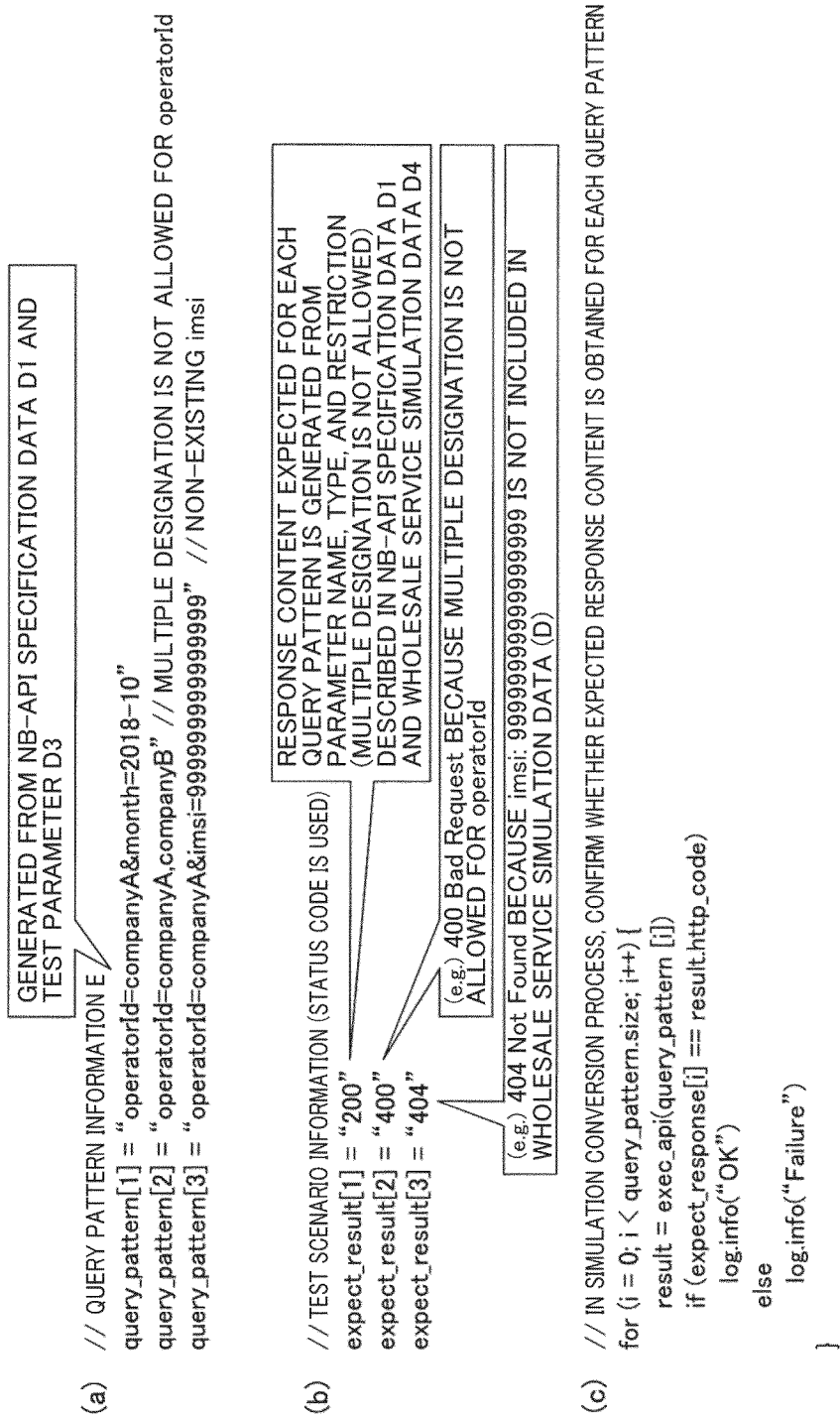
FIG. 3(a) is an example of query pattern information generated by an API adapter test assistance device of the API adapter test system according to the embodiment of the present invention.
FIG. 3(b) is an example of test scenario information generated by the API adapter test assistance device.
FIG. 3(c) is an example of information indicating a process of confirming whether an expected response content is obtained in a simulation conversion process.

On the other hand, the test scenario creation unit 25 of the API adapter test assistance device 20 generates a plurality of pieces of query pattern information E (see FIG. 3(a)). The plurality of pieces of query pattern information E are generated by a combination of parameters used for the health determination test process in the NB-API specification data D1 as a query pattern included in the first API request used for the health determination test on the basis of the NB-API specification data D1 and the test parameter D3 of the file information read by the file reading unit 21. Then, from the information in the NB-API specification data D1 regarding the generated query pattern information E and the wholesale service simulation data D4, information indicating the response content expected to be acquired by the API signal converted by the test target API adapter Y is generated as the test scenario information F for each piece of query pattern information E (see FIG. 3(b)) (S8).

When the test scenario information is generated by the test scenario creation unit 25, the test scenario information is executed by the test scenario execution unit 26 and an NB-API request is input to the API adapter (S9). The API adapter converts the NB-API request into a wholesale service API request and sends the same to the wholesale service API simulation device 30. The wholesale service API simulation function execution unit 31 of the wholesale service API simulation device 30 generates a wholesale service API response, which is a response to the wholesale service API request (S10). The API adapter converts the wholesale service API response again, generates an NB-API response, and sends the same to the test scenario execution unit 26 of the API adapter test assistance device 20 (S11).

The test result information generation unit 27 determines for each query pattern whether an expected response content is obtained by the API adapter on the basis of the response content acquired in step S11 and the response content in the test scenario information generated in step S8 (see FIG. 3(c)). Then, "OK" information is assigned to the query pattern in which the expected response content is obtained, and "NG" information is assigned to the query pattern in which the expected response content is not obtained, whereby test result information as illustrated in FIG. 4 is generated. The generated test result information is transmitted from the test result information generation unit 27 to the developer terminal 10 (S12), and is acquired and output by the test result information acquisition unit 13 of the developer terminal 10 (S13).

According to the above embodiment, it is possible to easily determine the health of the wholesale service API adapter created for a predetermined wholesale service API by a simple process.

REFERENCE SIGNS LIST

1 API adapter test system
10 Developer terminal
11 Data storage unit
12 Data transmission unit
13 Test result information acquisition unit
20 API adapter test assistance device
21 File reading unit
22 Wholesale service API simulation function code generation unit
23 Wholesale service API simulation data input unit
24 Wholesale service API simulation function deployment unit
25 Test scenario creation unit
26 Test scenario execution unit
27 Test result information generation unit
30 Wholesale service API simulation device
31 Wholesale service API simulation function execution unit

The invention claimed is:

1. An API adapter test system including: an API adapter test assistance device for assisting a health determination test of an API adapter for an API of a predetermined service; a developer terminal connected to the API adapter test assistance device; and a service API simulation device connected to the API adapter test assistance device and the API adapter test assistance device, wherein the developer terminal includes: a data transmission unit, including one or more processors, configured to transmit first specification data that defines Northbound-API (NB-API) specifications, second specification data that defines service API specifications, test parameters used for the health determination test, and service simulation data for generating response data for a second API request after a first API request which is an input signal to the API adapter is converted by the API adapter to the API adapter test assistance device; and a test result information acquisition unit, including one or more processors, configured to acquire test result information transmitted from the API adapter test assistance device when data is transmitted from the data transmission unit, the service API simulation device includes: a service API simulation function execution unit, including one or more processors, configured to transmit a second API response that is a response to the second API request in order to perform the health determination test of the API adapter, and the API adapter test assistance device includes: a service API simulation function deployment unit, including one or more processors, configured to generate a stub for the second API request using the second specification data transmitted from the developer terminal and the service simulation data and transmits the stub for deployment in the service API simulation function execution unit of the service API simulation device; a test scenario creation unit, including one or more processors, configured to generate a query pattern to be included in the first API request used for the health determination test on the basis of the first specification data transmitted from the developer terminal and the test parameters and generates a test scenario indicating an expected response content using the service simulation data for each query pattern; a test scenario execution unit, including one or more processors, configured to execute the generated test scenario; and a test result information generation unit, including one or more processors, configured to receive a first API response in which the second API response is converted by the API adapter and determines the health on the basis of whether an expected response is obtained for each query pattern.

2. An API adapter test assistance device for performing a health determination test of an API adapter in order to execute a predetermined service, comprising: a service API simulation function deployment unit, including one or more processors, configured to generate a stub for a second API request after a first API request which is an input signal to the API adapter is converted by the API adapter using second specification data transmitted from a developer terminal and service simulation data and transmits the stub to a service API simulation device; a test scenario creation unit, including one or more processors, configured to generate a query pattern to be included in the first API request used for the health determination test on the basis of the first specification data transmitted from the developer terminal and test parameters and generates a test scenario indicating an expected response content using the service simulation data for each query pattern; a test scenario execution unit that executes the generated test scenario; and a test result information generation unit, including one or more processors, configured to receive a first API response in which a second API response that is a response to the second API request is converted by the API adapter and determines the health on the basis of whether an expected response is obtained for each query pattern.

3. An API adapter test assistance method of performing a health determination test of an API adapter in order to execute a predetermined service, comprising: a service API simulation function deployment step of generating a stub for a second API request after a first API request which is an input signal to the API adapter is converted by the API adapter using second specification data transmitted from a developer terminal and service simulation data and transmitting the stub to a service API simulation device; a test scenario creation step of generating a query pattern to be included in the first API request used for the health determination test on the basis of the first specification data transmitted from the developer terminal and test parameters and generating a test scenario indicating an expected response content using the service simulation data for each query pattern; a test scenario execution step of executing the generated test scenario; and a test result information generation step of receiving a first API response in which a second API response that is a response to the second API request is converted by the API adapter and determines the health on the basis of whether an expected response is obtained for each query pattern.

4. A non-transitory computer readable medium storing an API adapter test assistance program for performing functions of the device according to claim 2.

* * * * *